United States Patent
Panov et al.

(10) Patent No.: US 8,786,366 B1
(45) Date of Patent: Jul. 22, 2014

(54) AMPLIFIER CIRCUIT (71) Applicants: Georgi Panov, Munich (DE); Rinaldo Zinke, Munich (DE)

(72) Inventors: Georgi Panov, Munich (DE); Rinaldo Zinke, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 1 day.

(21) Appl. No.: 13/747,553

(22) Filed: Jan. 23, 2013

(51) Int. Cl.
*H03F 3/45* (2006.01)

(52) U.S. Cl.
USPC .......................................... 330/255; 330/264

(58) Field of Classification Search
USPC .................................................. 330/252–264
See application file for complete search history.

(56) References Cited

U.S. PATENT DOCUMENTS 8,193,862 B2 * 6/2012 Adachi ........................ 330/255

OTHER PUBLICATIONS

Johan Huijsing, Operational Amplifiers: Theory and Design, book, Apr. 28, 2011, p. 105-153, 2nd Edition, Springer Science+Business Media B.V.
Xicheng Jiang et al., A Low-Power, High-Fidelity Stereo Audio Codec in 0.13 μm CMOS, IEEE Journal of Solid-State Circuits, vol. 47, No. 5, May 2012, p. 1221-1231.

* cited by examiner

*Primary Examiner* — Hieu Nguyen (57) ABSTRACT

An amplifier circuit is described comprising a first field effect transistor comprising a first source/drain terminal coupled to a first supply terminal, a second source/drain terminal coupled to an output of the amplifier circuit and a gate terminal; a second field effect transistor comprising a first source/drain terminal coupled to an input of the amplifier circuit, a second source/drain terminal coupled to the gate terminal of the first field effect transistor and a gate terminal; a third field effect transistor comprising a first source/drain terminal coupled to a first bias current source of the amplifier circuit, a second source/drain terminal and a gate terminal coupled to its first source/drain terminal and the gate terminal of the second field effect transistor; a fourth field effect transistor comprising a first source/drain terminal coupled to a second bias current source, a second source/drain terminal coupled to a second supply terminal and a gate terminal coupled to the second source/drain terminal of the third field effect transistor; and a control circuit coupled to the gate of the fourth field effect transistor configured to control the source drain voltage of the fourth field effect transistor by means of the gate of the fourth field effect transistor to be equal to a reference voltage.

13 Claims, 6 Drawing Sheets

AMPLIFIER CIRCUIT

TECHNICAL FIELD

The present disclosure relates to amplifier circuits.

BACKGROUND

In certain electronic devices, such as portable electronic devices, e.g. cell phones, low-power operational amplifiers which can drive low impedance loads are used. For low power consumption and high driving capability, AB class amplifiers are a typical choice for such amplifiers. For an AB class amplifier, bias current control is needed. AB class amplifiers with bias current control that is stable, e.g. in case of varying supply voltage or varying loads, are desirable.

SUMMARY

An amplifier circuit is provided including a first field effect transistor including a first source/drain terminal coupled to a first supply terminal, a second source/drain terminal coupled to an output of the amplifier circuit and a gate terminal; a second field effect transistor including a first source/drain terminal coupled to an input of the amplifier circuit, a second source/drain terminal coupled to the gate terminal of the first field effect transistor and a gate terminal; a third field effect transistor including a first source/drain terminal coupled to a first bias current source of the amplifier circuit, a second source/drain terminal and a gate terminal coupled to its first source/drain terminal and the gate terminal of the second field effect transistor; a fourth field effect transistor including a first source/drain terminal coupled to a second bias current source, a second source/drain terminal coupled to a second supply terminal and a gate terminal coupled to the second source/drain terminal of the third field effect transistor; and a control circuit coupled to the gate of the fourth field effect transistor configured to control the source drain voltage of the fourth field effect transistor by means of the gate of the fourth field effect transistor to be equal to a reference voltage.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. These aspects of this disclosure are described in sufficient detail to enable those skilled in the art to practice the invention. Other aspects of this disclosure may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Class AB amplifiers (or class AB outputs stages) offer high driving capability with a low power consumption and are therefore a popular choice for output stages.

Bias current control may be used to ensure low distortion of an AB class amplifier.

A first type of bias current control of an AB class amplifier is feed-forward control. This is illustrated in FIG. 1.

Figure 1:
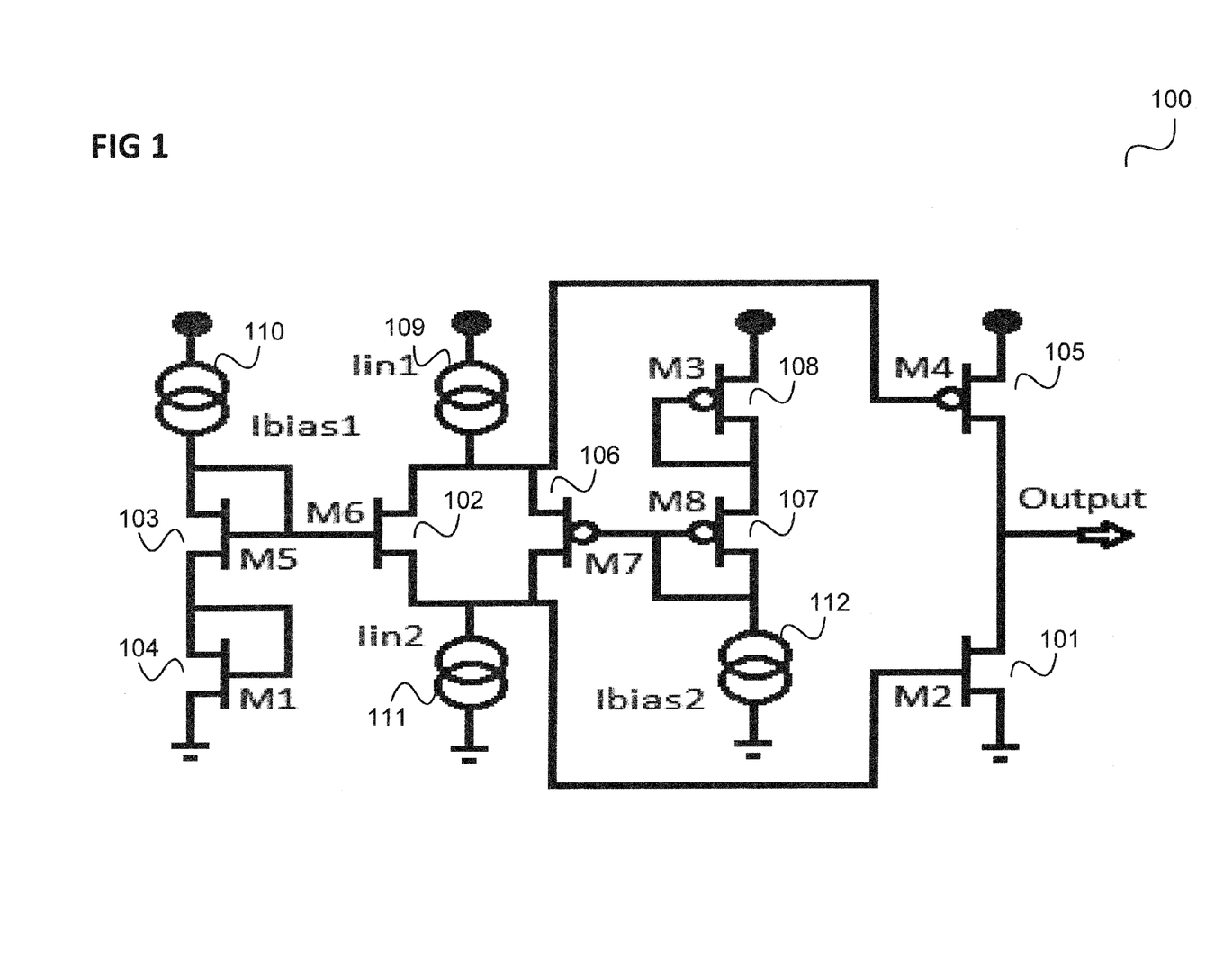
FIG. 1 shows an amplifier circuit including feed-forward bias current control.

FIG. 1 shows an amplifier circuit 100.

The amplifier circuit 100 implements an AB class amplifier (or AB class output stage).

It includes a first field effect transistor 101 whose drain is coupled to the output of the amplifier circuit 100 and whose source is coupled to the low supply potential. The gate of the first field effect transistor 101 is coupled to the source of a second field effect transistor 102. The drain of the second field effect transistor 102 is coupled to a first input current source 109. The gate of the second field effect transistor 102 is coupled to the gate of a third field effect transistor 103 whose drain is coupled to its gate and to a first bias current source 110. The source of the third field effect transistor 103 is coupled to the drain of a fourth field effect transistor 104 whose gate is coupled to its drain and whose source is coupled to the low supply potential.

Similarly, the amplifier circuit 100 includes a fifth field effect transistor 105 whose drain is coupled to the output of the amplifier circuit 100 and whose source is coupled to the high supply potential. The gate of the fifth field effect transistor 105 is coupled to the source of a sixth field effect transistor 106. The drain of the sixth field effect transistor 106 is coupled to a second input current source 111. The gate of the sixth field effect transistor 106 is coupled to the gate of a seventh field effect transistor 107 whose drain is coupled to its gate and to a second bias current source 112. The source of the seventh field effect transistor 107 is coupled to the drain of an eighth field effect transistor 108 whose gate is coupled to its drain and whose source is coupled to the high supply potential.

The first field effect transistor 101 and the fifth field effect transistor 105 can be seen as the actual amplifying transistors of the amplifier circuit 100 while the second field effect transistor 102, the third field effect transistor 103, the fourth field effect transistor 104, the sixth field effect transistor 106, the seventh field effect transistor 107 and the eighth field effect transistor 108 can be seen to be used for bias current control.

In this example, the first, second, third and fourth field effect transistors 101 to 104 are n-channel field effect transistors, e.g. NMOS (n channel Metal Oxide Semiconductor) transistors and the fifth, sixth, seventh and eighth field effect transistors 105 to 108 are p-channel field effect transistors.

The bias current through the first field effect transistor 101 and the fifth field effect transistor 105 may be set by the choice of the current Ibias1 provided the first bias current source 110, the current Ibias2 provided by the second bias current source 112, the dimensioning of the fourth field effect transistor 104 and the dimensioning of the eighth field effect transistor 108.

However, in the amplifier circuit 100 the first field effect transistor 101 and the fourth field effect transistor 104 as well as the fifth field effect transistor 105 and the eighth field effect transistor 108 may work with different drain source voltages. For example, the source drain voltage of the first field effect transistor and the source drain voltage of the first second effect transistor depend on the supply voltage.

Further, the first field effect transistor 101, the fourth field effect transistor 104, the fifth field effect transistor 105 and the eighth field effect transistors 108 may be short channel devices (e.g. in view of a reduction of power consumption). Since for a short channel field effect transistor the dependence of the current through the field effect transistor from the drain source voltage is typically relatively high, the bias current through the first field effect transistor 101 and the fifth field effect transistor 105 may depend on the supply voltage such that the precision of the bias current control is rather low.

An alternative to feed forward bias current control is feedback bias current control which allows more precise control of the bias current but it is rather complex and typically requires means to ensure that the circuit stays stable.

In the following, an amplifier circuit is described which allows ensuring that the drain source voltage of a field effect transistor used for bias control and the drain source voltage of a field effect transistor whose bias current is controlled (such as the fourth transistor 104 and the first transistor 101 of the amplifier circuit 100) are equal such that the control of the bias current can be done with high precision even in case of usage of short channel transistors.

Figure 2:
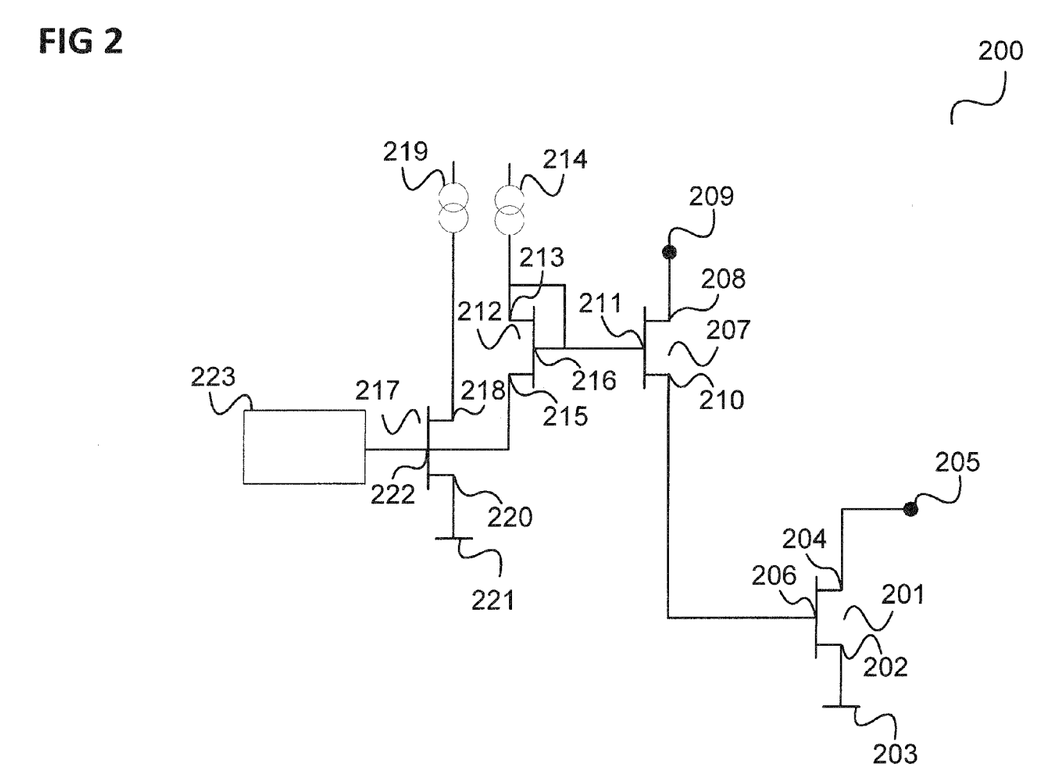
FIG. 2 shows an amplifier circuit including a control circuit for controlling the source drain voltage of a transistor used for bias current control.

FIG. 2 shows an amplifier circuit 200.

The amplifier circuit 200 includes a first field effect transistor 201 including a first source/drain terminal 202 coupled to a first supply terminal 203, a second source/drain terminal 204 coupled to an output 205 of the amplifier circuit and a gate terminal 206.

The amplifier circuit 200 further includes a second field effect transistor 207 including a first source/drain terminal 208 coupled to an input 209 of the amplifier circuit 200, a second source/drain terminal 210 coupled to the gate terminal 206 of the first field effect transistor 201 and a gate terminal 211.

The amplifier circuit 200 further includes a third field effect transistor 212 including a first source/drain terminal 213 coupled to a first bias current source 214 of the amplifier circuit 200, a second source/drain terminal 215 and a gate terminal 216 coupled to its first source/drain terminal 213 and the gate terminal 211 of the second field effect transistor 207.

The amplifier circuit 200 further includes a fourth field effect transistor 217 including a first source/drain terminal 218 coupled to a second bias current source 219, a second source/drain terminal 220 coupled to a second supply terminal 221 and a gate terminal 222 coupled to the second source/drain terminal 215 of the third field effect transistor 216.

The amplifier circuit 200 further includes a control circuit 223 coupled to the gate terminal 222 of the fourth field effect transistor 217 configured to control the source drain voltage of the fourth field effect transistor 217 by means of the gate of the fourth field effect transistor 217 to be equal to a reference voltage.

In other words, the source drain voltage of a transistor used to control the bias current to another transistor (used as amplifying transistor) is set to a reference voltage, e.g. the source drain voltage of the other transistor. For example, the amplifier circuit 200 allows providing a feed-forward controlled class AB output stage with a special biasing which allows precise control of the bias current through the amplifying transistors.

The first field effect transistor 201 can be seen as the amplifying transistor of the amplifier circuit 200 while the second field effect transistor 207, the third field effect transistor 212 and the fourth field effect transistor 217 can be seen as transistors used for bias current control.

It should be noted that the amplifier circuit 200 as shown in FIG. 2 can be seen to form one branch of an AB class output stage, i.e. the bias control for one amplifying transistor (corresponding to the first field effect transistor 201) of the AB class output stage. The amplifier circuit 200 may include a similar second branch for the second amplifying transistor of the AB class output stage. It should further be noted that while in FIG. 2, the field effect transistors 201, 207, 2012 and 217 are shown as n channel field effect transistors, they may also be p channel field effect transistors.

Two components being coupled may be understood as that the two components are electrically connected or that an electrically conductive connection exists between the two components.

The control circuit for example includes an operational amplifier including a first input coupled to the first source/drain terminal of the fourth field effect transistor, a second input coupled to the reference voltage and an output coupled to the gate of the fourth field effect transistor.

The reference voltage is for example the common mode output voltage of the amplifier circuit which is for example equal to one half of the high supply voltage (e.g. VDD).

The first bias current source and the second bias current source are for example formed by a single current source.

The first supply terminal is for example coupled to a supply potential and the second supply terminal is for example coupled to a supply potential.

For example, the first supply terminal and the second supply terminal are coupled to the same supply potential.

The first field effect transistor, the second field effect transistor, the third field effect transistor and the fourth field effect transistor are for example all n channel field effect transistors or are all p channel field effect transistors.

The amplifier circuit may further include a fifth field effect transistor including a first source/drain terminal coupled to a first supply terminal, a second source/drain terminal coupled to the output of the amplifier circuit and a gate terminal; a sixth field effect transistor including a first source/drain terminal coupled to a second input of the amplifier circuit and the second source/drain terminal of the second field effect transistor, a second source/drain terminal coupled to the gate terminal of the fifth field effect transistor and the first source/drain terminal of the second field effect transistor and a gate terminal; a seventh field effect transistor including a first source/drain terminal coupled to a third bias current source of the amplifier circuit, a second source/drain terminal and a gate terminal coupled to its first source/drain terminal and the gate terminal of the sixth field effect transistor; an eighth field effect transistor including a first source/drain terminal coupled to a fourth bias current source, a second source/drain terminal coupled to a fourth supply terminal and a gate terminal coupled to the second source/drain terminal of the seventh field effect transistor; and a second control circuit coupled to the gate of the eighth field effect transistor configured to control the source drain voltage of the eighth field effect transistor by means of the gate of the eighth field effect transistor to be equal to the reference voltage.

For example, the first field effect transistor, the second field effect transistor, the third field effect transistor and the fourth field effect transistor are all n channel field effect transistors and the fifth field effect transistor, the sixth field effect transistor, the seventh field effect transistor and the eighth field effect transistor are all p channel field effect transistors and the first supply terminal and the second supply terminal are coupled to the low supply potentials and the third supply terminal and the fourth supply terminal are coupled to high supply potentials.

For example, the third supply terminal and the fourth supply terminal are coupled to the same high supply potential.

The second control circuit for example includes a second operational amplifier including a first input coupled to the first source/drain terminal of the eighth field effect transistor, a second input coupled to the reference voltage and an output coupled to the gate of the eighth field effect transistor.

The third bias current source and the fourth bias current source are for example formed by a single current source.

The amplifier circuit is for example a class AB output stage.

In the following, an example is described in more detail.

Figure 3:
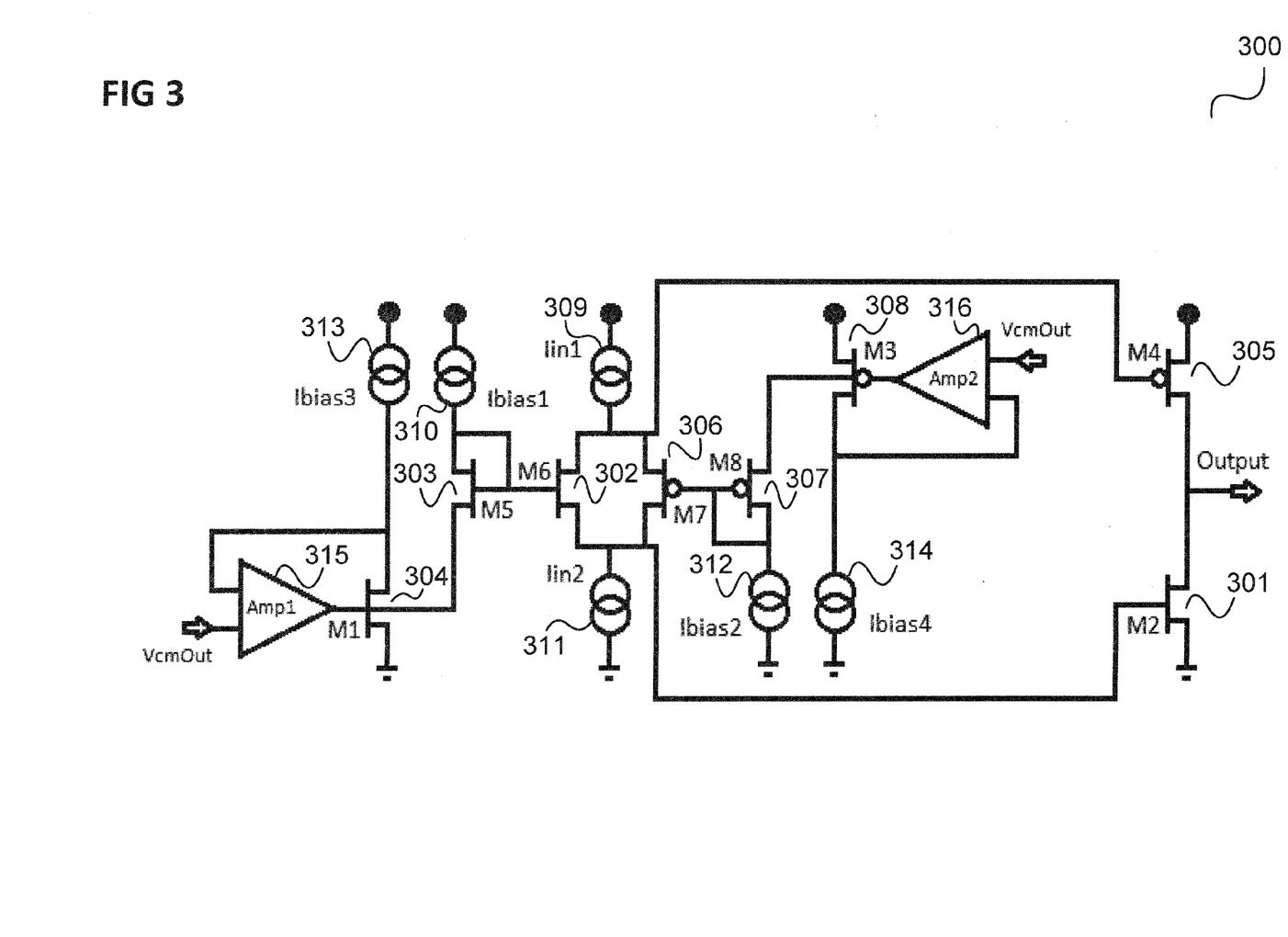
FIG. 3 shows an amplifier circuit including operational amplifier for controlling the source drain voltage of two transistors used for bias current control.

FIG. 3 shows an amplifier circuit 300.

The amplifier circuit 300 includes a first field effect transistor 301 whose drain is coupled to the output of the amplifier circuit 300 and whose source is coupled to the low supply potential. The gate of the first field effect transistor 301 is coupled to the source of a second field effect transistor 302. The drain of the second field effect transistor 302 is coupled to a first input current source 309. The gate of the second field effect transistor 302 is coupled to the gate of a third field effect transistor 303 whose drain is coupled to its gate and to a first bias current source 310. The source of the third field effect transistor 303 is coupled to the gate of a fourth field effect transistor 304 whose source is coupled to the low supply potential and whose drain is coupled to a second bias current source 313 (which may be the same as the first bias current source 310). The amplifier circuit 300 further includes a first operational amplifier 315 having a first input coupled to the drain of the fourth field effect transistor 304 and a second input receiving the common mode output voltage VcmOut of the amplifier circuit 300 and an output coupled to the gate of the fourth field effect transistor 304. The common mode output voltage VcmOut is for example half the high supply potential VDD.

Analogously, the amplifier circuit 300 includes a fifth field effect transistor 305 whose drain is coupled to the output of the amplifier circuit 300 and whose source is coupled to the high supply potential. The gate of the fifth field effect transistor 305 is coupled to the source of a sixth field effect transistor 306. The drain of the sixth field effect transistor 306 is coupled to a second input current source 311. The gate of the sixth field effect transistor 306 is coupled to the gate of a seventh field effect transistor 307 whose drain is coupled to its gate and to a third bias current source 312. The source of the seventh field effect transistor 307 is coupled to the gate of an eighth field effect transistor 308 whose source is coupled to the high supply potential and whose drain is coupled to a fourth bias current source 314 (which may be the same as the third bias current source 312). The amplifier circuit 300 further includes a second operational amplifier 316 having a first input coupled to the drain of the eighth field effect transistor 308 and a second input receiving the common mode output voltage of the amplifier circuit 300 and an output coupled to the gate of the eighth field effect transistor 308.

In this example, the first, second, third and fourth field effect transistors 301 to 304 are n-channel field effect transistors, e.g. NMOS (n channel Metal Oxide Semiconductor) transistors and the fifth, sixth, seventh and eighth field effect transistors 305 to 308 are p-channel field effect transistors.

The first operational amplifier 315 keeps the drain source voltage of the fourth transistor 304 equal to VcmOut which is the output common mode voltage of the amplifier circuit 300. The second operational amplifier 316 keep the drain source voltage of the eighth transistor 316 equal to VcmOut. Thus, the fourth transistor 104 and the first transistor 101 work with the same drain source voltage and the eighth transistor 308 and the fifth transistor 305 work with the same drain source voltage. As a result the output current, i.e. the current through the fifth transistor 305 and the first transistor 101 is well defined by the bias currents of the bias current sources 310, 312, 313, 314 (denoted Ibias1, Ibias2, Ibias3 and Ibias4 in FIG. 3).

Figure 4:
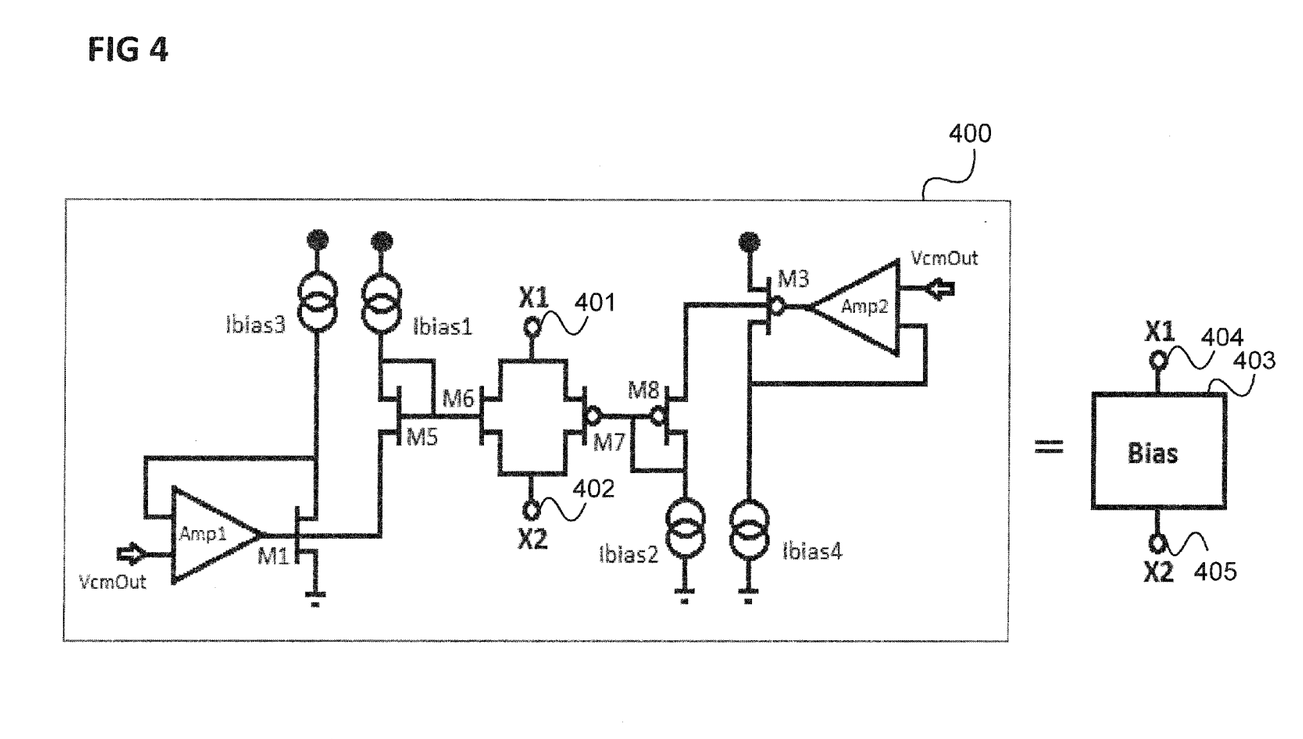
FIG. 4 shows a bias circuit.

The part of the amplifier circuit 300 which can be seen as the bias circuit (or bias current controlling circuit) is illustrated in FIG. 4.

FIG. 4 shows a bias circuit 400.

The bias circuit 400 corresponds to the amplifier circuit 300 with the first field effect transistor 301 and the fifth field effect transistor 305 being omitted and the first input current source 309 being replaced by a first input terminal 401 and the second input current source 311 being replaced by a second input terminal 402. The bias circuit 400 is in the following figures represented by a block 403 with a first input 404 corresponding to the first input 401 and a second input 405 corresponding to the second input 402.

Figure 5:
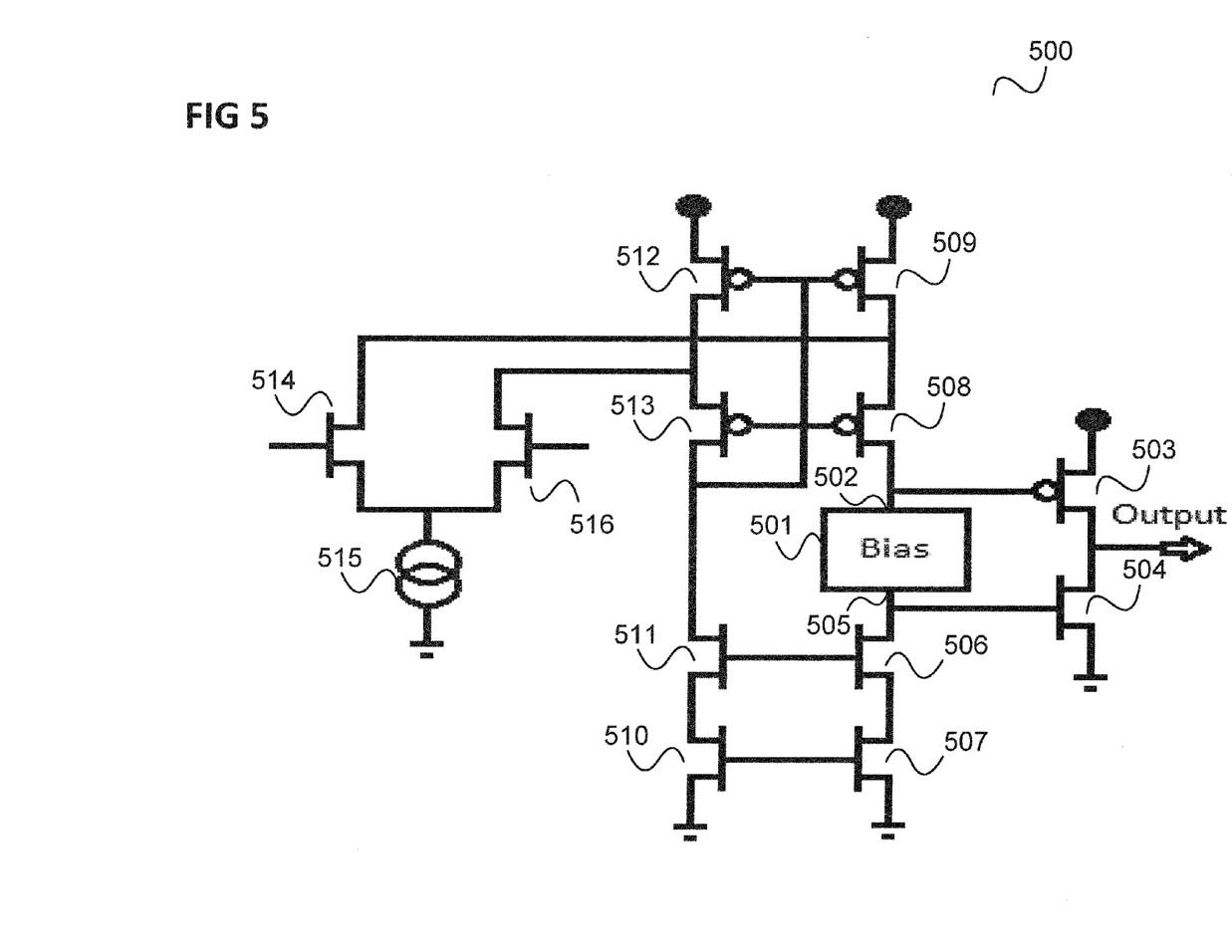
FIG. 5 shows an amplifier circuit including the bias circuit of FIG. 4 implementing a differential amplifier with single output.

A possible implementation of an operational amplifier with the bias circuit 400 is illustrated in FIG. 5.

FIG. 5 shows an amplifier circuit 500.

The amplifier circuit 500 includes a bias circuit 501 corresponding to the bias circuit 400.

The first input 502 of the bias circuit 501 is coupled to the gate of a first p channel field effect transistor 503 whose source is coupled to the high supply potential (VDD) and whose source is coupled to an output of the amplifier circuit and the drain of a first n channel field effect transistor 504 whose source is coupled to the low supply potential (e.g. VSS or ground) and whose gate is coupled to the second input 505 of the bias circuit 501.

The second input 505 is further coupled to the drain of a second n channel field effect transistor 506 whose source is coupled to the drain of an n channel third field effect transistor 507 whose source is coupled to the low supply potential.

The first input 504 is further coupled to the drain of a second p channel field effect transistor 508 whose source is coupled to the drain of a third p channel field effect transistor 509 whose source is coupled to the high supply potential.

The amplifier circuit 500 further includes a fourth n channel field effect transistor 510 whose source is coupled to the low supply potential and whose drain is coupled to the source of a fifth n channel field effect transistor 511 and a fourth p channel field effect transistor 512 whose source is coupled to the high supply potential and whose drain is coupled to the source of a fifth p channel field effect transistor 513.

The gate of the second n channel field effect transistor 506 is coupled to the gate of the fifth n channel field effect transistor 511, the gate of the third n channel field effect transistor 507 is coupled to the gate of the fourth n channel field effect transistor 510, the gate of the second p channel field effect transistor 508 is coupled to the gate of the fifth p channel field effect transistor 513 and the gate of the third p channel field effect transistor 509 is coupled to the gate of the fourth p channel field effect transistor 512.

Further, the gate of the third p channel field effect transistor 509 is coupled to the drain of the fifth p channel field effect transistor 513 and the drain of the fifth p channel field effect transistor 513 is coupled to the drain of the fifth n channel field effect transistor 511.

The amplifier circuit 500 further includes a sixth n channel field effect transistor 514 whose drain is coupled is coupled to the drain of the third p channel field effect transistor 509 and whose source is coupled to a bias current source 515. The amplifier circuit 500 further includes a seventh n channel field effect transistor 516 whose drain is coupled is coupled to the drain of the fourth p channel field effect transistor 512 and whose source is coupled to the bias current source 515. The bias current source 515 is coupled between the drains of the sixth p channel field effect transistor 514 and the seventh p channel field effect transistor 516 and the low supply potential.

The gates of the sixth p channel field effect transistor 514 and the seventh p channel field effect transistor 516 from the differential inputs of the amplifier circuit 500.

Figure 6:
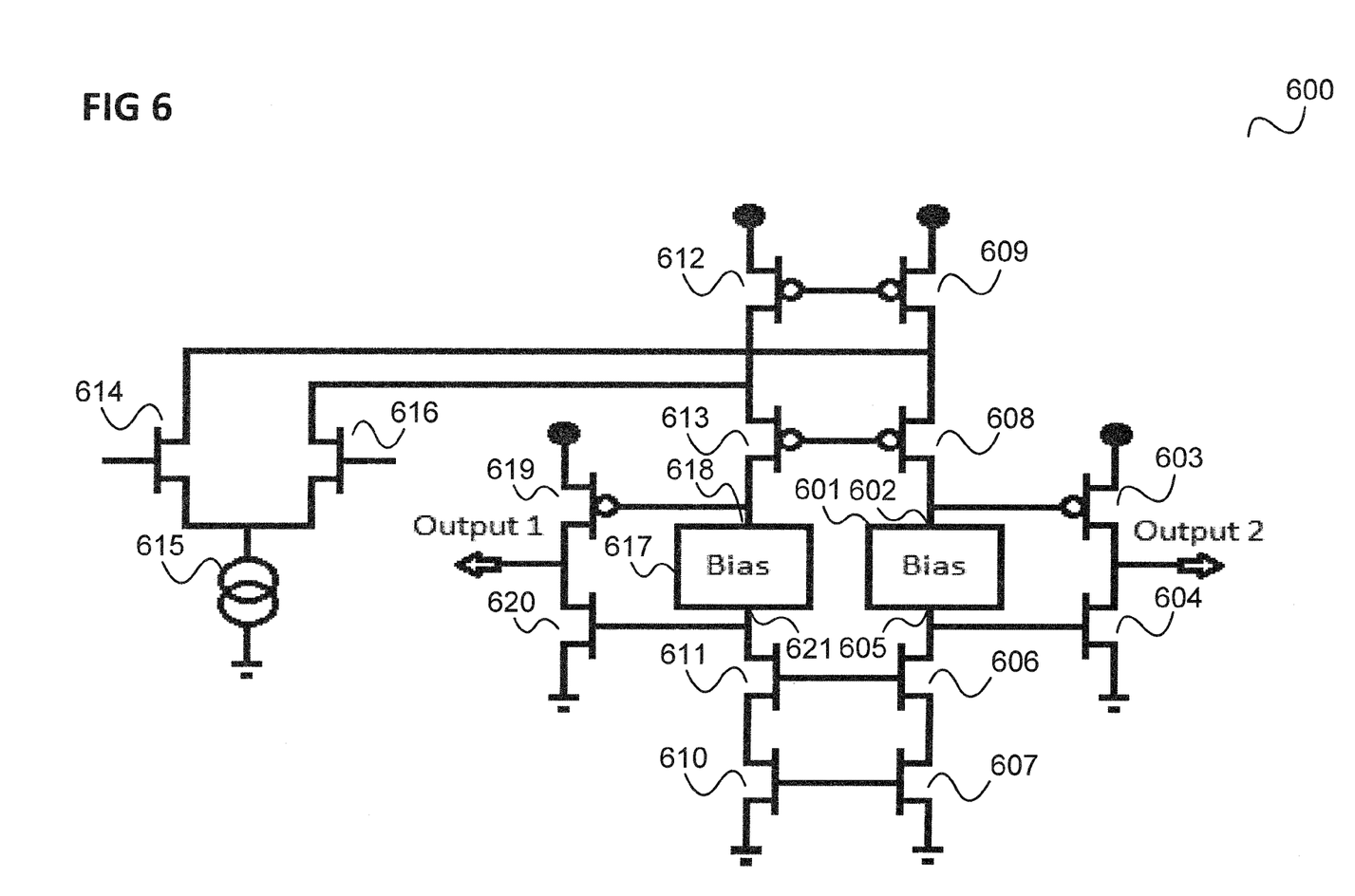
FIG. 6 shows an amplifier circuit including the bias circuit of FIG. 4 implementing a differential amplifier including the bias circuit of FIG. 4 implementing a differential amplifier with two differential outputs.

A possible implementation of a fully differential operational amplifier with the bias circuit 400 is illustrated in FIG. 6.

FIG. 6 shows an amplifier circuit 600.

The amplifier circuit 600 has components 601 to 615 corresponding to the components 501 to 615 and the same structure as the amplifier circuit 500 except that Further, the gate of the third p channel field effect transistor 609 is not coupled to the drain of the fifth p channel field effect transistor 613 and the drain of the fifth p channel field effect transistor 513 is not coupled to the drain of the fifth n channel field effect transistor 511 but is rather coupled to the first input of a second bias circuit 617 corresponding to the bias circuit 400. The second input of the second bias circuit 617 is coupled to the drain of the fifth n channel field effect transistor 511.

Further, the first input 618 of the second bias circuit 617 is coupled to the gate of a sixth p channel field effect transistor 619 whose source is coupled to the high supply potential and whose drain is coupled to the drain of an eighth n channel field effect transistor 620 whose gate is coupled to the second input 621 of the second bias circuit 617 and whose source is coupled to the low supply potential.

The drain of the sixth p channel field effect transistor 619 is further coupled to a further output. This further output and the output to which the drain of the first p channel field effect transistor 603 is coupled form the differential outputs of the amplifier circuit 600.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. An amplifier circuit comprising
a first field effect transistor comprising a first source/drain terminal coupled to a first supply terminal, a second source/drain terminal coupled to an output of the amplifier circuit and a gate terminal;
a second field effect transistor comprising a first source/drain terminal coupled to an input of the amplifier circuit, a second source/drain terminal coupled to the gate terminal of the first field effect transistor and a gate terminal;
a third field effect transistor comprising a first source/drain terminal coupled to a first bias current source of the amplifier circuit, a second source/drain terminal and a gate terminal coupled to its first source/drain terminal and the gate terminal of the second field effect transistor;
a fourth field effect transistor comprising a first source/drain terminal coupled to a second bias current source, a second source/drain terminal coupled to a second supply terminal and a gate terminal coupled to the second source/drain terminal of the third field effect transistor; and
a control circuit coupled to the gate of the fourth field effect transistor configured to control the source drain voltage of the fourth field effect transistor by means of the gate of the fourth field effect transistor to be equal to a reference voltage.

2. Amplifier circuit according to claim 1, wherein the control circuit comprises an operational amplifier comprising a first input coupled to the first source/drain terminal of the fourth field effect transistor, a second input coupled to the reference voltage and an output coupled to the gate of the fourth field effect transistor.

3. Amplifier circuit according to claim 1, wherein the reference voltage is the common mode output voltage of the amplifier circuit.

4. Amplifier circuit according to claim 1, wherein the first bias current source and the second bias current source are formed by a single current source.

5. Amplifier circuit according to claim 1, wherein the first supply terminal is coupled to a supply potential and the second supply terminal is coupled to a supply potential.

6. Amplifier circuit according to claim 1, wherein the first supply terminal and the second supply terminal are coupled to the same supply potential.

7. Amplifier circuit according to claim 1, wherein the first field effect transistor, the second field effect transistor, the third field effect transistor and the fourth field effect transistor are all n channel field effect transistors or are all p channel field effect transistors.

8. Amplifier circuit according to claim 1, further comprising a fifth field effect transistor comprising a first source/drain terminal coupled to a first supply terminal, a second source/drain terminal coupled to the output of the amplifier circuit and a gate terminal;
a sixth field effect transistor comprising a first source/drain terminal coupled to a second input of the amplifier circuit and the second source/drain terminal of the second field effect transistor, a second source/drain terminal coupled to the gate terminal of the fifth field effect transistor and the first source/drain terminal of the second field effect transistor and a gate terminal;
a seventh field effect transistor comprising a first source/drain terminal coupled to a third bias current source of the amplifier circuit, a second source/drain terminal and a gate terminal coupled to its first source/drain terminal and the gate terminal of the sixth field effect transistor;
an eighth field effect transistor comprising a first source/drain terminal coupled to a fourth bias current source, a second source/drain terminal coupled to a fourth supply terminal and a gate terminal coupled to the second source/drain terminal of the seventh field effect transistor; and
a second control circuit coupled to the gate of the eighth field effect transistor configured to control the source drain voltage of the eighth field effect transistor by means of the gate of the eighth field effect transistor to be equal to the reference voltage.

9. Amplifier circuit according to claim 8, wherein the first field effect transistor, the second field effect transistor, the third field effect transistor and the fourth field effect transistor are all n channel field effect transistors and the fifth field effect transistor, the sixth field effect transistor, the seventh field effect transistor and the eighth field effect transistor are all p channel field effect transistors and wherein the first supply terminal and the second supply terminal are coupled to the low supply potentials and the third supply terminal and the fourth supply terminal are coupled to high supply potentials.

10. Amplifier circuit according to claim 9, wherein the third supply terminal and the fourth supply terminal are coupled to the same high supply potential.

11. Amplifier circuit according to claim 8, wherein the second control circuit comprises a second operational amplifier comprising a first input coupled to the first source/drain terminal of the eighth field effect transistor, a second input coupled to the reference voltage and an output coupled to the gate of the eighth field effect transistor.

12. Amplifier circuit according to claim 8, wherein the third bias current source and the fourth bias current source are formed by a single current source.

13. Amplifier circuit according to claim 8, being a class AB output stage.

* * * * *